(12) United States Patent
Endres

(10) Patent No.: US 9,921,484 B2
(45) Date of Patent: Mar. 20, 2018

(54) ILLUMINATION SYSTEM AND ILLUMINATION OPTICAL UNIT FOR EUV PROJECTION LITHOGRAPHY

(71) Applicant: Carl Zeiss SMT GmbH, Oberkochen (DE)

(72) Inventor: Martin Endres, Koenigsbronn (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/067,436

(22) Filed: Mar. 11, 2016

(65) Prior Publication Data
US 2016/0195816 A1 Jul. 7, 2016

Related U.S. Application Data

(63) Continuation of application No. PCT/EP2014/067958, filed on Aug. 25, 2014.

(30) Foreign Application Priority Data

Sep. 18, 2013 (DE) ........................ 10 2013 218 749

(51) Int. Cl.
G03F 7/20 (2006.01)

(52) U.S. Cl.
CPC .......... G03F 7/702 (2013.01); G03F 7/70075 (2013.01); G03F 7/70116 (2013.01)

(58) Field of Classification Search
CPC .. G03F 7/702; G03F 7/70075; G03F 7/70116; G03F 7/70233
See application file for complete search history.

(56) References Cited

U.S. PATENT DOCUMENTS

| 6,438,199 | B1 | 8/2002 | Schultz et al. |
| 6,658,084 | B2 | 12/2003 | Singer |
| 6,859,515 | B2 | 2/2005 | Schultz et al. |
| 2006/0208206 | A1* | 9/2006 | Hainz ................. G03F 7/70083 250/493.1 |

(Continued)

FOREIGN PATENT DOCUMENTS

| DE | 10 2006 036 064 A1 | 2/2008 |
| DE | 10 2009 030 501 A1 | 1/2011 |

(Continued)

OTHER PUBLICATIONS

German Office Action, with translation thereto, for corresponding DE Appl No. 10 2013 218 749.1, dated May 21, 2014.

(Continued)

*Primary Examiner* — Steven H Whitesell Gordon
(74) *Attorney, Agent, or Firm* — Fish & Richardson P.C.

(57) ABSTRACT

An illumination optical unit for EUV projection lithography guides illumination light toward an object field. A field facet mirror of the illumination optical unit has a multiplicity of individual mirrors which are switchable between at least two tilting positions. A pupil facet mirror of the illumination optical unit has a plurality of stationary pupil facets and is disposed downstream of the field facet mirror in the beam path of the illumination light. The pupil facets serve for the at least sectionally superimposing imaging of a group of the individual mirrors of the field facet mirror into the object field via a group-mirror illumination channel.

20 Claims, 8 Drawing Sheets

(56) References Cited

U.S. PATENT DOCUMENTS

| | | | |
|---|---|---|---|
| 2008/0013680 A1 | 1/2008 | Singer et al. | |
| 2008/0278704 A1 | 11/2008 | Endres et al. | |
| 2009/0041182 A1* | 2/2009 | Endres | G03F 7/70075 378/34 |
| 2011/0001947 A1* | 1/2011 | Dinger | G02B 26/06 355/67 |
| 2011/0085151 A1* | 4/2011 | Deguenther | G03F 7/70116 355/67 |
| 2012/0038898 A1* | 2/2012 | Klaassen | G03F 7/70133 355/71 |
| 2012/0147347 A1 | 6/2012 | Mann et al. | |
| 2013/0194559 A1 | 8/2013 | Patra | |

FOREIGN PATENT DOCUMENTS

| | | |
|---|---|---|
| DE | 10 2009 045 694 A1 | 4/2011 |
| DE | 10 2012 210 174 A1 | 6/2013 |
| DE | 10 2012 201 235 A1 | 8/2013 |
| EP | 1 225 481 A | 7/2002 |
| WO | WO 2008/149178 A1 | 12/2008 |
| WO | WO 2009/100856 A1 | 8/2009 |
| WO | WO 2010/037453 A1 | 4/2010 |
| WO | WO 2010/104163 A | 9/2010 |

OTHER PUBLICATIONS

International Search Report for corresponding PCT Appl No. PCT/EP2014/067958, dated Feb. 18, 2015.

* cited by examiner

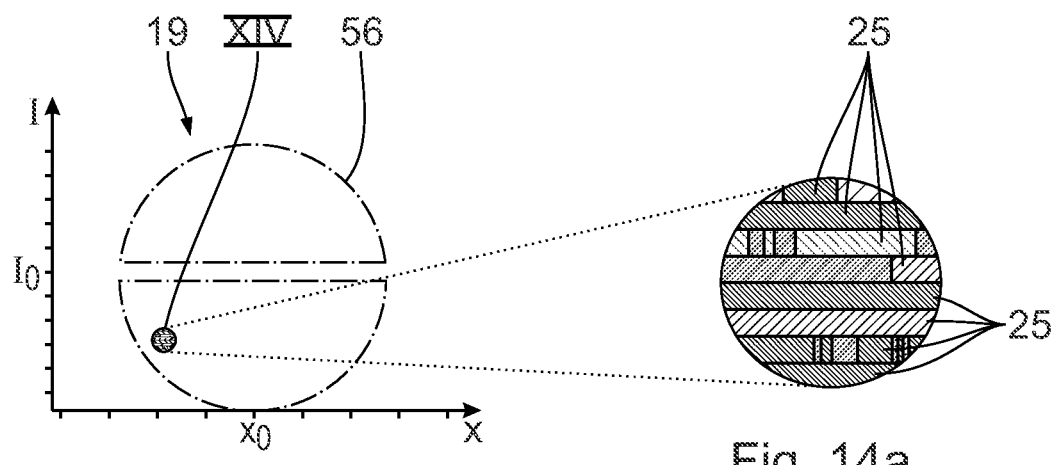
Fig. 14
Fig. 14a
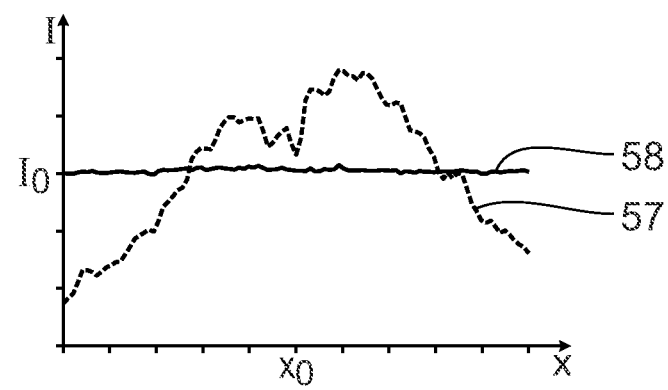
Fig. 15

ILLUMINATION SYSTEM AND ILLUMINATION OPTICAL UNIT FOR EUV PROJECTION LITHOGRAPHY

CROSS-REFERENCE TO RELATED APPLICATIONS

The present application is a continuation of, and claims benefit under 35 USC 120 to, international application PCT/EP2014/067958 filed Aug. 25, 2014, which claims benefit under 35 USC 119 of German Application No. 10 2013 218 749.1, filed Sep. 18, 2013. The entire disclosure of international application PCT/EP2014/067958 is incorporated by reference herein.

FIELD

The disclosure relates to an illumination optical unit for EUV projection lithography for guiding illumination light toward an object field, in which a lithography mask is arrangeable. Furthermore, the disclosure relates to an illumination system, in particular including such an illumination optical unit, to a projection exposure apparatus including such an illumination system, to a method for producing a micro- or nanostructured component, in particular a semiconductor chip, with the aid of such a projection exposure apparatus, and to a micro- or nanostructured component produced by this method.

BACKGROUND

An illumination optical unit of the type mentioned in the introduction is known from WO 2010/037453 A1, WO 2010/104163 A, WO 2008/149178 A1, US 2011/0001947 A1, US 2009/0041182 A1 and DE 10 2006 036 064 A1.

SUMMARY

The aim of the illumination is to superimpose the illumination light guided via different illumination channels of the illumination optical unit in the illumination field in a manner as free from losses as possible, while complying with predefined illumination parameters within likewise predefined tolerance ranges.

The disclosure seeks to provide an illumination optical unit which provides an optimization of an illumination and, in particular, an optimized superimposition of the illumination light guided via different illumination channels in the illumination field.

In one aspect, the disclosure provides an illumination optical unit for EUV projection lithography for guiding illumination light toward an object field, in which a lithography mask is arrangeable and is displaceable along an object displacement direction during the projection exposure. The illumination optical unit includes: a field facet mirror including a multiplicity of individual mirrors which are switchable between at least two tilting positions and which provide individual-mirror illumination channels for guiding illumination light partial beams toward the object field; and a pupil facet mirror including a plurality of stationary pupil facets, which is disposed downstream of the field facet mirror in the beam path of the illumination light, wherein the pupil facets in each case contribute to the at least sectionally superimposing imaging of a group of the individual mirrors of the field facet mirror into the object field via a group-mirror illumination channel. Respectively one of the pupil facets is assigned to respectively one of the groups of the individual mirrors that are to be imaged. An individual-mirror group that is imageable completely into the object field has a nominal number of individual mirrors. The number of the pupil facets, on which illumination light can impinge simultaneously via the individual-mirror groups, multiplied by the nominal number of the individual mirrors per individual-mirror group, yields as a result a number of individual mirrors that is greater than the actual number of the individual mirrors on the field facet mirror. An assignment of the individual mirrors to the individual-mirror groups is such that this assignment is used for the correction of a dependence of an illumination light intensity integrated along the object displacement direction on an object field height perpendicular to the object displacement direction.

In one aspect, the disclosure provides an illumination optical unit for EUV projection lithography for guiding illumination light toward an object field, in which a lithography mask is arrangeable and is displaceable along an object displacement direction during the projection exposure. The illumination optical unit includes: a field facet mirror including a multiplicity of individual mirrors which are switchable between at least two tilting positions and which provide individual-mirror illumination channels for guiding illumination light partial beams toward the object field; and a pupil facet mirror including a plurality of stationary pupil facets, which is disposed downstream of the field facet mirror in the beam path of the illumination light, wherein the pupil facets in each case contribute to the at least sectionally superimposing imaging of a group of the individual mirrors of the field facet mirror into the object field via a group-mirror illumination channel. Respectively one of the pupil facets is assigned to respectively one of the groups of the individual mirrors that are to be imaged. An individual-mirror group that is imageable completely into the object field has a nominal number of individual mirrors. The number of the pupil facets, on which illumination light can impinge simultaneously via the individual-mirror groups, multiplied by the nominal number of the individual mirrors per individual-mirror group, yields as a result a number of individual mirrors that is greater than the actual number of the individual mirrors on the field facet mirror. An assignment of the individual mirrors to the individual-mirror groups is such that this assignment is used for the correction of an imaging tilting of the respective individual-mirror group into the object field.

In one aspect, the disclosure provides an illumination system including an illumination optical unit for EUV projection lithography for guiding illumination light toward an object field, in which a lithography mask is arrangeable and is displaceable along the object displacement direction during the projection exposure. The illumination system includes a field facet mirror, arranged in a far field of an EUV light source of the illumination system, including a multiplicity of individual mirrors which are switchable between at least two tilting positions and which provide individual-mirror illumination channels for guiding illumination light partial beams toward the object field. The individual mirrors are groupable into individual-mirror groups which are assigned in each case to pupil facets of a pupil facet mirror disposed downstream of the field facet mirror in the beam path of the illumination light, for the purpose of imaging the respective individual-mirror group, into the object field via the assigned pupil facet. Thus generated images of the individual-mirror groups are at least partly superimposed in the object field. The individual mirrors of the field facet mirror are arranged in the far field of the light source such that a proportion of at least 80% of an area of the far field is covered by the individual mirrors such that the latter reflect the illumination light.

The disclosure departs from the concept of individual-mirror groups being imaged into the object field such that the images of the individual-mirror groups in each case completely cover the object field. Individual-mirror groups whose images in each case completely cover the object field are also designated hereinafter as complete individual-mirror groups. Relinquishing the boundary condition mentioned affords new degrees of freedom in the assignment of the individual mirrors of the field facet mirror to individual-mirror groups that are imaged into the object field via in turn assigned pupil facets. According to the disclosure, then, individual-mirror groups are also permitted which lead to an image that does not completely cover the object field. Such individual-mirror groups whose images do not completely cover the object field are also designated hereinafter as fractional individual-mirror groups. This results in the possibility of adapting an outer contour of a field facet mirror very well to an actual profile of the far field of the EUV light source in which the field facet mirror is intended to be arranged. It is no longer necessary, for example, with the individual-mirror groups, to tile such a far field region with groups of identical size and shape, and so the losses in edge regions of the far field, which losses are unavoidable with such tiling, can now be avoided. Relinquishing the boundary condition mentioned affords the possibility of utilizing the far field in a manner that has not been possible heretofore. By way of example, it is also possible to cover a proportion of more than 80% of the far field area by the individual mirrors of the field facet mirror, for example even more than 85% or an even greater percentage. An edge delimiting the far field area is defined as an outer boundary of the far field on which an intensity fraction $k_r$ of a maximum far field illumination light intensity impinges. The fraction $k_r$ can be for example the value 0.1, 0.05 or an even smaller value. $k_r$ can also have the value $1/e$ or $1/e^2$.

The newly provided flexibility in the assignment of the individual mirrors to individual-mirror groups furthermore makes it possible to use this assignment for the correction or compensation of illumination parameters and/or of imaging effects. Examples thereof are given by illumination optical units described herein. With a given number of individual mirrors on the field facet mirror, a larger number of individual-mirror groups can then be formed and, correspondingly, a larger number of pupil facets can be impinged on simultaneously by illumination light. This results in a higher flexibility in the predefinition of illumination angle distributions, that is to say illumination settings for the object field illumination. The pupil facets can in turn be constructed as groups of individual small pupil facet mirrors. If such an illumination optical unit, in which the number of the pupil facets that can be impinged on simultaneously, multiplied by a nominal number of the individual mirrors per individual-mirror group, yields a larger number than the actual number of the individual mirrors on the field facet mirror, is illuminated in the reverse direction, that is to say from the object field, or, if the object field is imaged into an image field via a projection optical unit, from the image field, there arises on the field facet mirror a pattern of illuminated sections that are impinged on by light with a first intensity and further illuminated sections that are impinged on with a second, higher, and in particular twice as high, intensity. In these field facet sections that are impinged on with the higher intensity during such a reverse exposure, individual mirrors of the facet mirror are arranged which can be assigned optionally to different pupil facets on which illumination light can impinge simultaneously. The field facet sections illuminated with higher intensity regularly have a number of individual mirrors that is smaller than the nominal number of the individual mirrors.

For the correction or compensation of a dependence of the scan-integrated illumination intensity on the object field height, the individual-mirror groups can be divided such that group shapes are used which have a smaller scan-integrated extent in field height regions in which a higher illumination intensity is inherently present, for example on account of a corresponding far field distribution. Alternatively or additionally, an imaging tilting correction or compensation is possible which does not presuppose that individual-mirror groups are adjacent to one another via wedge-shaped area regions that are not usable for reflection.

The use of a far field proportion that is as large as possible or the correction or compensation of illumination parameters and/or of imaging effects can be carried out without losses, since the light which is reflected by all the individual mirrors of the field facet mirror can be used in principle. Of course, alternatively it is possible to mask out in a targeted manner the light of selected individual mirrors for further influencing of illumination parameters and/or of imaging, such that the light of these individual mirrors does not contribute to the illumination of the object field.

At least some of the individual mirrors can be arranged in at least one change section of the field facet mirror, wherein the individual mirrors within the change section, depending on the individual-mirror tilting position, are assignable to two different individual-mirror groups that are imaged into the object field via different pupil facets, and wherein the change section has an extent perpendicular to the object displacement direction which, imaged into the object field, amounts to at most half of an extent of the object field perpendicular to the object displacement direction. At least one change section enables a flexible grouping of the individual mirrors into the respectively desired other individual-mirror group adjacent to the change section. The at least one change section can also have perpendicular to the object displacement direction an extent that is less than half of an extent of the object field perpendicular to the object displacement direction, and that amounts for example to 40%, 35%, 30% or an even smaller percentage of an extent of the object field perpendicular to the object displacement direction.

The at least one change section can have an extent that amounts to between 5% and 80% of the extent of a complete individual-mirror group.

The change section can be arranged such that an individual mirror that is arranged in the change region, depending on the individual-mirror tilting position and thus depending on its assignment to the respective individual-mirror group, is imaged in the image positions whose distance from one another perpendicular to the scanning direction is greater than 10% of an extent of the object field perpendicular to the scanning direction. The change section can be arranged such that an individual mirror that is arranged in the change region, depending on the individual-mirror tilting position and thus depending on its assignment to the respective individual-mirror group, is imaged in image positions whose distance from one another in the scanning direction is greater than 40% of an extent of the object field in the scanning direction. Such image position differences lead to corresponding degrees of freedom in the influencing of intensity and/or of imaging during the superimposing illumination of the object field via the individual-mirror groups.

An assignment of the individual mirrors in the change section of the field facet mirror can be such that the two individual-mirror groups that include the individual mirrors in the change section result in an illumination light impingement—integrated along the object displacement direction—on the object field in a central region of the object field via a larger number of individual mirror illumination channels and in an edge region of the object field. An assignment of the individual mirrors in the change section of the field facet mirror can be such that the two individual-mirror groups that include the individual mirrors in the change section result in an illumination light impingement—integrated along the object displacement direction—on the object field in an edge region of the object field via a larger number of individual-mirror illumination channels than in a central region of the object field. Such arrangements of the individual mirrors in the change section enable a correction or compensation of typical field height dependencies of a scan-integrated illumination intensity.

An assignment of the individual mirrors in the change section of the field facet mirror can be such that the two individual-mirror groups that include the individual mirrors in the change section result in an illumination light impingement—integrated along the object displacement direction—on the object field in an edge region of the object field via a number of individual-mirror illumination channels than in a central region of the object field. Such an arrangement of the individual mirrors in the change section is neutral with regard to a scan-integrated illumination intensity dependence over the field height.

At least some of the individual mirrors can be arranged in a change section of the field facet mirror, wherein the individual mirrors within the change section, depending on the individual-mirror tilting position, are assignable to two different individual-mirror groups that are imaged into the object field via different pupil facets, and wherein the change section has an extent along the object displacement direction which increases monotonically in a dimension perpendicular to the object displacement direction. Such a design of the change section has proved to be particularly suitable for the imaging tilting correction or compensation. Apart from the fact that there is generally no increase in the extent of the change section along the object displacement direction in the dimension perpendicular to the object displacement direction within the dimension of a respective individual mirror, the increase in the extent of the change section along the object displacement direction in the dimension perpendicular to the object displacement direction can be strictly monotonic and can be linear, in particular. A quantization of the extent of the change section on account of the finite extent of the individual mirrors is thus disregarded in the case of this strictly monotonic and in particular linear increase.

The advantages explained above apply particularly to an illumination system described herein.

An illumination system can include an illumination optical unit described herein and an EUV light source. An optical system can include an illumination optical unit as described herein and a projection optical unit for imaging the object field into an image field. A projection exposure apparatus can include an illumination optical system as described herein, an EUV light source, an object holder and a wafer holder. A production method can include using such a projection exposure apparatus. The advantages of such illumination systems, optical systems, projection exposure apparatus and production methods correspond to those which have already been explained above with reference to the illumination system and the illumination optical unit. A micro- or nanostructured component can be produced by the production method. Such a component can be produced with high structural resolution. In this way it is possible, for example, to produce a semiconductor chip having a high integration or storage density.

BRIEF DESCRIPTION OF THE DRAWINGS

Exemplary embodiments of the disclosure are explained in greater detail below with reference to the drawings, in which:

FIG. 14 shows a plan view of the entire field facet mirror in a greatly reduced manner in comparison with the individual-mirror group illustrations according to FIGS. 3 and 6, for example;

FIG. 14a shows a segment enlargement in the region XIV from FIG. 14 with an exemplary assignment of the individual mirrors to individual-mirror groups illustrated with different types of hatching, which reflect light in each case onto a pupil facet of the illumination optical unit; and FIG. 15 shows in a diagram two examples of a dependence of the total illumination intensity over the field height for two different assignment configurations of the individual mirrors to the individual-mirror groups, wherein, in each case within defined change sections between two individual-mirror groups adjacent to one another, a change of individual mirrors present there from one individual-mirror group to the other individual-mirror group has been effected.

DETAILED DESCRIPTION

Figure 1:
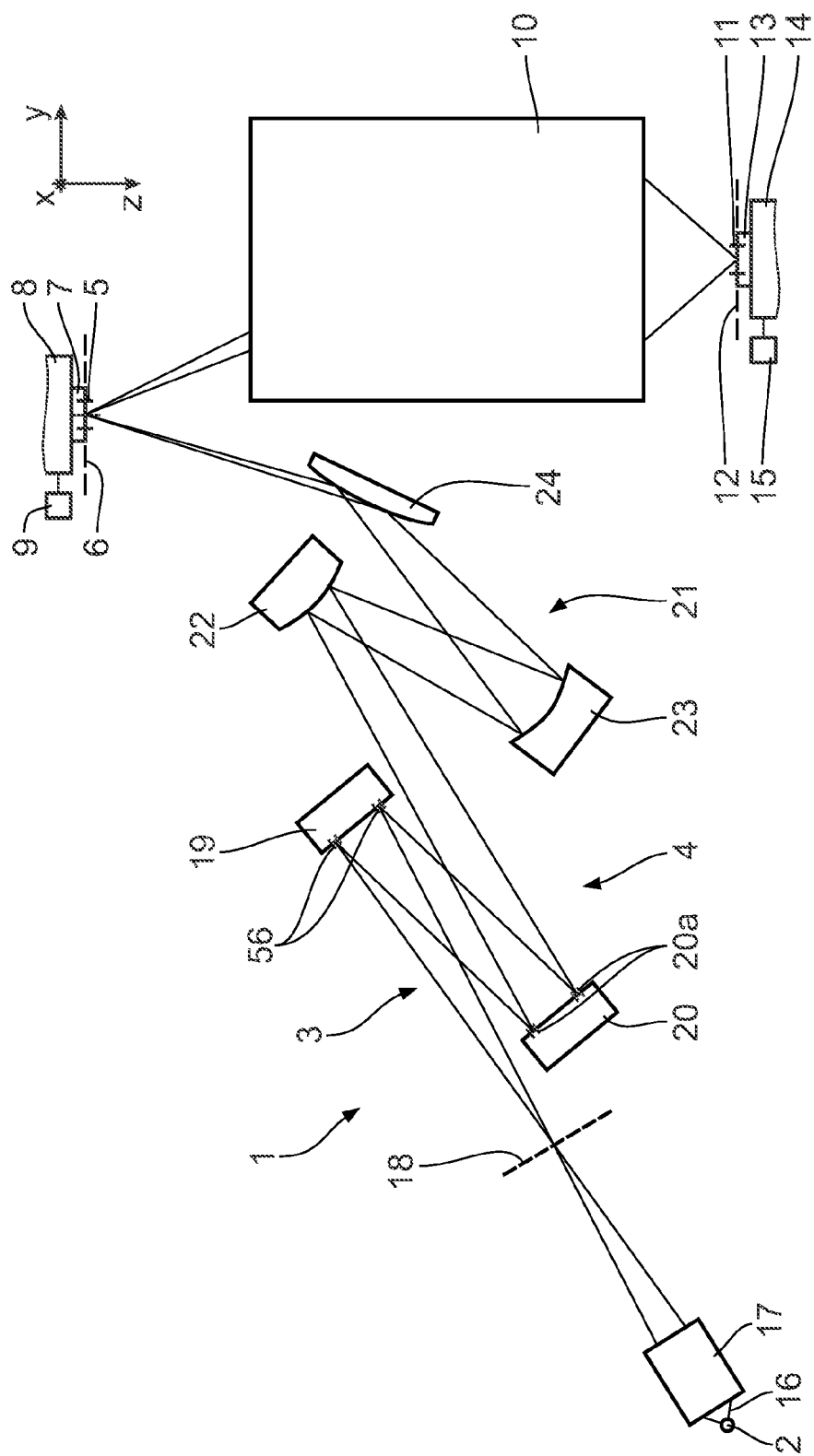
FIG. 1 schematically shows a meridional section through a projection exposure apparatus for EUV projection lithography.

FIG. 1 schematically shows a projection exposure apparatus 1 for microlithography in a meridional section. The projection exposure apparatus 1 includes a light or radiation source 2. An illumination system 3 of the projection exposure apparatus 1 has an illumination optical unit 4 for exposing an illumination field coinciding with an object field 5 in an object plane 6. In this case, an object in the form of a reticle 7 arranged in the object field 5, the reticle being held by an object or reticle holder 8, is exposed. The reticle 7 is also designated as a lithography mask. The object holder 8 is displaceable along a displacement direction via an object displacement drive 9. A projection optical unit 10 serves for imaging the object field 5 into an image field 11 in an image plane 12. A structure on the reticle 7 is imaged onto a light-sensitive layer of a wafer 13 arranged in the region of the image field 11 in the image plane 12. The wafer 13 is held by a wafer holder (likewise not illustrated). The wafer holder 14 is likewise displaceable along the displacement direction in a manner synchronized with the object holder 8 via a wafer displacement drive 15.

The radiation source 2 is an EUV radiation source having an emitted used radiation in the range of between 5 nm and 30 nm. This can be a plasma source, for example a GDPP (gas discharge-produced plasma) source or an LPP (laser-produced plasma) source. A radiation source based on a synchrotron or on a free electron laser (FEL) can also be used for the radiation source 2. Information about such a radiation source can be found by the person skilled in the art for example from U.S. Pat. No. 6,859,515 B2. EUV radiation 16 emerging from the radiation source 2 is focused by a collector 17. A corresponding collector is known from EP 1 225 481 A. Downstream of the collector 17, the EUV radiation 16 propagates through an intermediate focal plane 18 before being incident on a field facet mirror 19. The field facet mirror 19 is a first facet mirror of the illumination optical unit 4. The field facet mirror 19 has a multiplicity of individual mirrors (not illustrated in FIG. 1). The field facet mirror 19 is arranged in a plane of the illumination optical unit 4 which is optically conjugate with respect to the object plane 6.

The EUV radiation 16 is also referred to hereinafter as illumination light or as imaging light.

Downstream of the field facet mirror 19, the EUV radiation 16 is reflected by a pupil facet mirror 20. The pupil facet mirror 20 is a second facet mirror of the illumination optical unit 4. The pupil facet mirror 20 is arranged in a pupil plane of the illumination optical unit 4, which is optically conjugate with respect to the intermediate focal plane 18 and with respect to a pupil plane of the projection optical unit 10 or coincides with the pupil plane. The pupil facet mirror 20 has a plurality of pupil facets 20a, of which two pupil facets 20a are illustrated schematically in FIG. 1. With the aid of the pupil facets of the pupil facet mirror 20 and a downstream imaging optical assembly in the form of a transfer optical unit 21 including mirrors 22, 23 and 24 designated in the order of the beam path, individual-mirror groups 25 (cf. FIG. 2, for example) of the field facet mirror 19, which are described in even greater detail below, are imaged into the object field 5. The last mirror 24 of the transfer optical unit 21 is a mirror for grazing incidence ("grazing incidence mirror").

In order to facilitate the description of positional relationships, FIG. 1 depicts a Cartesian xyz-coordinate system as a global coordinate system for the description of the positional relations of components of the projection exposure apparatus 1 between the object plane 6 and the image plane 12. The x-axis runs perpendicularly to the plane of the drawing into the latter in FIG. 1. The y-axis runs toward the right and parallel to the displacement direction of the object holder 8 and of the wafer holder 14 in FIG. 1. The z-axis runs downward in FIG. 1, that is to say perpendicularly to the object plane 6 and to the image plane 12.

The x-dimension over the object field 5 or the image field 11 is also designated as the field height.

Figure 2:
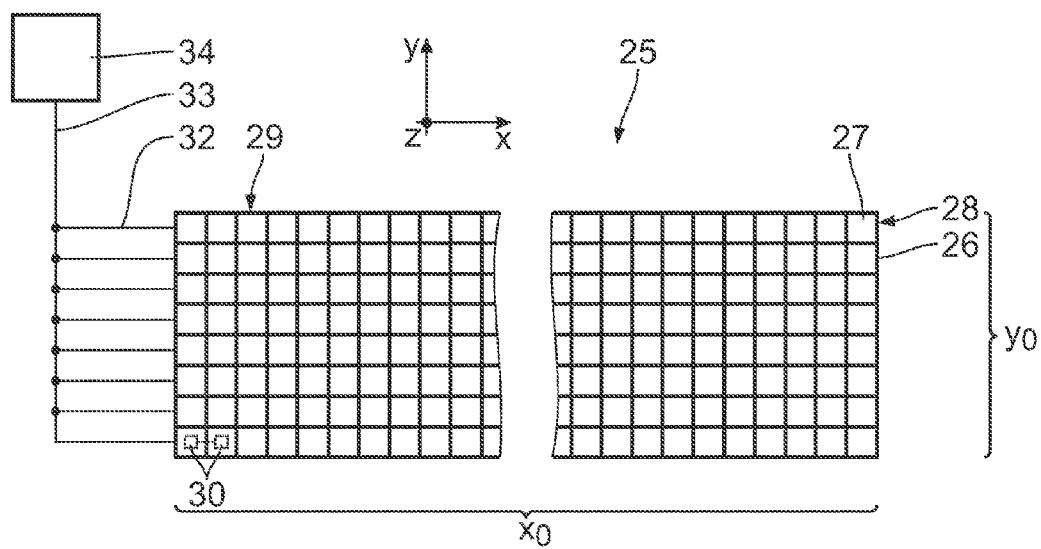
FIG. 2 schematically shows a plan view of a segment of a field facet mirror—constructed from individual mirrors—of an illumination optical unit for illumination of an object field, suitable for use in the projection exposure apparatus according to FIG. 1.

FIG. 2 shows details of the construction of a segment of the field facet mirror 19 in a highly schematic illustration. The segment of the field facet mirror 19 as illustrated in FIG. 2 is for example exactly one of the individual-mirror groups 25. An entire reflection surface 26 of the field facet mirror 19 is subdivided in rows and columns into a grid of individual mirrors 27, that is to say constitutes an individual-mirror array. Partial beams of the illumination light 16 are guided via the respective individual mirrors 27. The individual reflection surfaces of the specific individual mirrors 27 are embodied in a concave fashion. In an alternatively possible embodiment of the individual reflection surfaces of the specific individual mirrors 27, these are planar and have no curvature. An individual-mirror row 28 has a plurality of the individual mirrors 27 situated directly alongside one another. Tens to hundreds of the individual mirrors 27 can be provided in an individual-mirror row 28. In the example according to FIG. 2, the individual mirrors 27 are square. Other shapes of individual mirrors which enable the reflection surface 26 to be covered as far as possible without any gaps can also be used. Such alternative individual-mirror shapes are known from the mathematical theory of tiling. In this connection, reference should be made to the references indicated in WO 2009/100 856 A1.

Depending on the embodiment of the field facet mirror 19, an individual-mirror column 29 likewise has a plurality of the individual mirrors 27. By way of example, a few tens or a few hundreds of the individual mirrors 27 are provided per individual-mirror column 29.

In order to facilitate the description of positional relationships, FIG. 2 depicts a Cartesian xyz-coordinate system as a local coordinate system of the field facet mirror 19. Corresponding local xyz-coordinate systems are also found in the subsequent figures showing facet mirrors or a segment thereof in plan view. In FIG. 2, the x-axis runs horizontally toward the right parallel to the individual-mirror rows 28. The y-axis runs upward parallel to the individual-mirror columns 29 in FIG. 2. The z-axis is perpendicular to the plane of the drawing in FIG. 2 and runs out of the latter.

The y-direction of the global coordinate system according to FIG. 1, that is to say the displacement direction for the reticle 7 and the wafer 13, which is also referred to as the scanning direction, and the y-direction of the local coordinate system according to FIG. 2, that is to say the column direction of the individual-mirror array, in each case projected onto the xy-plane of the global coordinate system, need not run exactly parallel to one another, but rather can assume a, for example small, angle with respect to one another. A field shaping effect by the mirror 24 can also lead locally to deviations between the y-direction of the local coordinate system and the y-direction of the global coordinate system.

In the x-direction, the reflection surface 26 of the individual-mirror group 25 has an extent of $x_0$. In the y-direction, the reflection surface 26 of the individual-mirror group 25 has an extent of $y_0$.

Depending on the embodiment of the field facet mirror 19, the individual mirrors 27 have x/y-extents in the range of, for example, from 500 µm×500 µm to, for example, 2 mm×2 mm. The individual mirrors 27 can be shaped such that they have a focusing effect for the illumination light 16. Such a focusing effect of the individual mirrors 27 is advantageous particularly when using divergent illumination of the field facet mirror 19 with the illumination light 16. The entire field facet mirror 19 has an x/y-extent which, depending on the embodiment, is for example 300 mm×300 mm or 600 mm×600 mm. The individual-mirror groups 25 (cf. FIG. 7) have typical $x_0/y_0$-extents of 80 mm×6 mm or of 65 mm×5 mm or of 25 mm×4 mm or of 104 mm×8 mm. Insofar as the individual-mirror group 25 is imaged completely into the object field 5, the $x_0/y_0$ aspect ratio of the individual-mirror groups 25 can correspond to the x/y aspect ratio of the object field 5. In practice, the aspect ratio of the individual-mirror groups deviates from the aspect ratio of the object field and can be greater than the aspect ratio of the object field. Depending on the ratio between the size of the respective individual-mirror groups 25 and the size of the individual mirrors 27 from which the individual-mirror groups 25 are constructed, each of the individual-mirror groups 25 has a corresponding number of individual mirrors 27. Insofar as an individual-mirror group includes so many individual mirrors 27 that the image of the individual-mirror group completely covers the object field 5, the individual-mirror group is also designated hereinafter as a complete individual-mirror group.

For the individual deflection of impinged illumination light 16, each of the individual mirrors 27 is respectively connected to an actuator 30, as indicated by dashed lines in FIG. 2 on the basis of two individual mirrors 27 arranged in a corner at the bottom left of the reflection surface 26. The actuators 30 are arranged on that side of each of the individual mirrors 27 which faces away from a reflective side of the individual mirrors 27. The actuators 30 can be embodied as piezo-actuators, for example. Configurations of such actuators are known from the construction of micromirror arrays.

The actuators 30 of an individual-mirror row 28 are respectively connected via signal lines to a row signal bus 32. An individual-mirror row 28 is assigned in each case to one of the row signal buses 32. The row signal buses 32 of the individual-mirror rows 28 are connected, for their part, to a main signal bus 33. The latter is signal-connected to a control device 34 of the field facet mirror 19. The control device 34 is designed, in particular, for driving the individual mirrors 27 jointly in a serial fashion, that is to say row by row or column by column. Individual driving of the individual mirrors 27 is possible even within the individual-mirror rows 28 and the individual-mirror columns 29.

Each of the individual mirrors 27 is tiltable individually independently about two mutually perpendicular tilting axes, wherein a first of the tilting axes runs parallel to the x-axis and the second of these two tilting axes runs parallel to the y-axis. The two tilting axes lie in the individual reflection surfaces of the respective individual mirrors 27.

For further details of the individual-mirror construction of the field facet mirror 19, reference should be made to US 2011/0001947 A1.

A predefined tilting grouping of the individual mirrors 27 into the individual-mirror groups 25 each composed of at least two individual mirrors 27, as already mentioned above, is settable by the individual driving of the actuators 30 via the control device 34. The individual-mirror groups 25 are respectively assigned via at least one dedicated group-mirror illumination channel for the illumination light 16 to at least one dedicated pupil facet 20a of the pupil facet mirror 20 for imaging the individual-mirror group 25 into the object field 5. This assignment is effected by predefinition of the respective tilting position or switching position of the individual mirrors 27 belonging to the individual-mirror group 25 in such a way that the partial beam of the illumination light 16 which impinges on the respective individual mirror 27 is reflected from this individual mirror 27 toward the assigned pupil facet of the pupil facet mirror 20 and from there toward the object field 5. In this case, the group-mirror illumination channel is the totality of all the individual-mirror illumination channels of the respective individual-mirror group 25 which complement one another on account of the imaging via the pupil facet 20a for illuminating the illumination or object field 5. Each of the individual-mirror groups 25 can therefore be regarded as an original image of at least one section of the illumination field 5. In this case, the original image of the illumination field 5 is that structural form which is imaged exactly into the illumination field 5, taking account of the imaging aberrations. This structural form is also designated as the actual original image. In contrast thereto, the ideal original image of the illumination field 5 denotes that structural form which is imaged exactly into the illumination field 5 without taking account of imaging aberrations.

The total illumination of the illumination or object field 5 then constitutes a superposition of these original images.

Each of the individual-mirror groups 25 therefore basically has the function of a facet of a field facet mirror such as is disclosed for example in U.S. Pat. No. 6,438,199 B1 or U.S. Pat. No. 6,658,084 B2.

Figure 3:
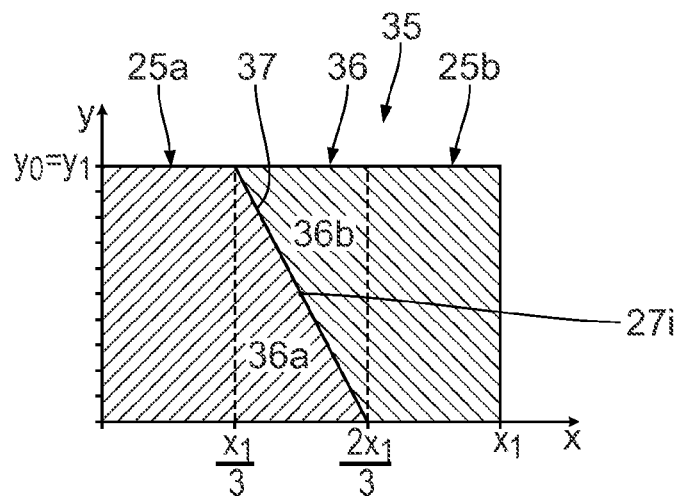
FIG. 3 schematically shows a plan view of a segment of the field facet mirror constructed from individual mirrors—in the region of two individual-mirror groups which can be assigned to in each case exactly one pupil facet of the illumination optical unit, wherein individual mirrors (not illustrated individually) of both individual-mirror groups are arranged in a common change section of the field facet mirror and are thus assignable to both individual-mirror groups.

FIG. 3 shows a segment 35 of the field facet mirror 19 in a plan view. The individual mirrors (not illustrated individually) within the segment 35 are assigned to two individual-mirror groups 25a, 25b that are imaged into the object field 5 via different pupil facets 20a. The two individual-mirror groups 25a, 25b within the segment 35 are illustrated by different hatchings in FIG. 3.

The segment 35 has an extent of $x_1$ in the x-direction and an extent of $y_1$ in the y-direction. The following holds true for the aspect ratio $x_1/y_1$:

$$x_1/y_1 = 3/2\ x_0/y_0.$$

The x/y aspect ratio of the segment 35 with the two individual-mirror groups 25a, 25b is thus 50% greater than the x/y aspect ratio of the object field 5.

The segment 35 of the field facet mirror 19 is subdivided into three sections in the x-direction perpendicular to the scanning direction y. Each of the sections constitutes a region between two field heights $x_i$ and $x_j$, which hereinafter is also written as [$x_i$; $x_j$].

In a section [0; $x_1/3$], all the individual mirrors of the segment 35 are assigned to exactly one first pupil facets 20a. In the same way, a section [2/3 $x_1$; $x_1$], that is to say the individual mirrors 27 arranged there, is assigned to the other pupil facets 20a. By tilting all the individual mirrors of the segment 35 within the section [0; $x_1/3$], for example, these individual mirrors, when an illumination setting is changed, can also be assigned to a different first pupil facet 20a for a defined group of first pupil facets 20a. This change of assignment always occurs jointly for all individual mirrors within the section [0; $x_1/3$] of the segment 35. The same correspondingly also applies to the individual mirrors in the section [2/3 $x_1$; $x_1$], a different group of first pupil facets 20a being involved here.

Between these two sections, a change section 36 of the segment 35 of the field facet mirror 19 lies in the region [1/3 $x_1$; 2/3 $x_1$]. The change section 36 is subdivided into two change subsections 36a, 36b via a separating line 37 between the (x, y)-coordinates ($x_1/3$, $y_1$) and (2/3 $x_1$, 0). The change subsection 36a together with the section having the x-coordinates [0; 1/3 $x_1$] forms the individual-mirror group 25a. The change subsection 36b together with the section having the x-coordinates [2/3 $x_1$, $x_1$] forms the individual-mirror group 25b. This subdivision of the change section 36 into the change subsections 36a, 36b is effected via the tilting position of the individual mirrors 27 arranged there. In this case, depending on their association with the individual-mirror groups 25a, 25b, the individual mirrors 27 are tilted such that all the individual mirrors 27 in a respective one of the two individual-mirror groups 25a, 25b guide the illumination light 16 via a common pupil facet 20a.

In the x-direction, that is to say perpendicular to the object displacement direction y, the change section 36 has an extent $x_1/3$, that is to say, imaged into the object field 5, the extent $x_0/2$, multiplied by an imaging scale β. Hereinafter, for the sake of simplicity, the imaging scale β is assumed to be β=1, such that, for example, an extent xo of the respective individual-mirror group 25 is equal to the object field extent $x_0$. The extent of the change section 36 perpendicular to the object displacement direction y is therefore, imaged into the object field 5, half of the extent $x_0$ of the object field 5 perpendicular to the object displacement direction y.

Figure 4:
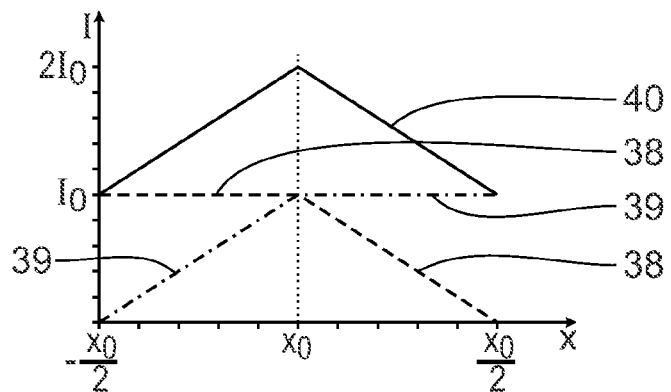
FIG. 4 shows in a diagram a dependence of an illumination intensity over a field height of an object field of the projection exposure apparatus, wherein the illumination intensity is generated by reflection at the individual mirrors of the two individual-mirror groups with the group assignment according to FIG. 3.

FIG. 4 shows the effects of a subdivision of the segment 35 into the two individual-mirror groups 25a, 25b on an illumination intensity distribution I as a function of the field height x of the object field 5 in the field height range [−$x_0/2$; +$x_0/2$]. In this case, an intensity contribution 38 of the individual-mirror group 25a is illustrated in a dashed manner and an intensity contribution 39 of the individual-mirror group 25b is illustrated in a dash-dotted manner. A total intensity contribution 40 over the field height x is illustrated in a solid manner. The intensity contributions 38 to 40 are illustrated at the respective field height x integrated over the scanning direction y. It is assumed here that the segment 35 of the field facet mirror 19 is impinged on with constant illumination intensity $I_0$.

The intensity contribution 38 of the individual-mirror group 25a, in the range [−$x_0/2$; 0], initially proceeds such that it is constant at the value $I_0$. At these field heights, integrated over the scanning direction y, the entire y-width of the segment 35 contributes to the object field illumination.

In the field height range [0; $x_0/2$], the intensity contribution 38 decreases linearly from the value Io to the value 0. This decrease results from the fact that a y-extent of the change subsection 36a of the individual-mirror group 25a decreases correspondingly linearly as far as the edge region of the individual-mirror group 25a at x=2/3 $x_1$ to the value 0.

The intensity contribution 39 of the individual-mirror group 25b is correspondingly mirror-inverted. In the field height range [$x_0/2$; 0], the change subsection 36b contributes to the object field illumination, such that a linearly increasing intensity contribution results here. In the field height range [0; $x_0/2$], a constant intensity contribution 39 results at $I=I_0$.

The total intensity contribution 40 results as addition of the two intensity contributions 38, 39, which total intensity contribution has, on account of the subdivision of the change section 36 according to the separating line 37, a roof-shaped profile having a maximum illumination intensity 2 $I_0$ at the field height x=0, which decreases linearly toward both edges −$x_0/2$, $x_0/2$ linearly to the illumination intensity $I_0$.

The subdivision of the change section 36 according to FIG. 3 thus gives rise to an illumination light impingement—integrated along the object displacement direction y—of the object field 5 in a central region of the object field 5, that is to say in the region of x=0, over a larger number of individual-mirror illumination channels than in an edge region of the object field 5, that is to say in the region of x=|$x_0/2$|.

The total number of the individual mirrors 27 in an individual-mirror group 25 whose image covers the entire object field 5 is also referred to hereinafter as the nominal number of the individual mirrors 27 per individual-mirror group 25.

Such an individual-mirror group that completely covers the object field 5 with its imaging is also referred to hereinafter as a complete individual-mirror group. The individual-mirror group 25 according to FIG. 2 is therefore a complete individual-mirror group.

Individual-mirror groups whose images cover only a fraction of the object field 5 are also referred to hereinafter as fractional individual-mirror groups. The individual-mirror groups 25a, 25b according to FIG. 3 are therefore fractional individual-mirror groups.

The total number of the individual mirrors 27 in the fractional individual-mirror groups 25a, 25b is less than a total number of individual mirrors 27 in the complete individual-mirror group 25 according to FIG. 2 whose image covers the entire object field 5. This is owing to the fact that the fractional individual-mirror groups 25a, 25b in each case do not include the entire change section 36, but rather in each case only a subsection 36a, 36b of the change section 36. The images of the individual-mirror groups 25a, 25b thus cover a fraction of the object field 5, exactly 75% of the total area of the object field 5 in the case of the embodiment illustrated. An area of the fractional individual-mirror groups corresponding to the individual-mirror groups 25a, 25b on the field facet mirror 19 is correspondingly less than an area of complete individual-mirror groups corresponding to the individual-mirror group 25 according to FIG. 2 whose image covers the entire object field 5. Assuming a given area of the reflection surface 26 of the field facet mirror 19 overall or a given total number of the individual mirrors 27 of the field facet mirror 19 overall, with such fractional individual-mirror groups having in part a change subsection corresponding to the change subsections 36a, 36b, the illumination light 16 can impinge on a larger number of pupil facets 20a than in the case of a subdivision into complete individual-mirror groups 26 whose images in each case cover the entire object field 5. The number of the pupil facets 20a which can be impinged on simultaneously by the illumination light 16 via the individual-mirror groups 25 of the field facet mirror 19, multiplied by the nominal number of a complete individual-mirror group 25, thus yields as a result a number of individual mirrors 27 that is greater than the actual number of individual mirrors 27 on the field facet mirror 19.

It thus holds true that:

$$N_{PF} \times N_N > N_{ESP}.$$

In this case, $N_{PF}$ is the number of the simultaneously used pupil facets 20a of the pupil facet mirror 20;

$N_N$ is the nominal number of the individual mirrors 27 per complete individual-mirror group 25, and $N_{ESP}$ is the number of the individual mirrors 27 of the entire field facet mirror 19.

The dependence of the total intensity contribution 40 on the field height x and the corresponding assignment of the individual mirrors 27 to the fractional individual-mirror groups 25a, 25b can be used for the correction of a dependence of an illumination light intensity—integrated along the object displacement direction y—on the object field height x.

Figure 5:
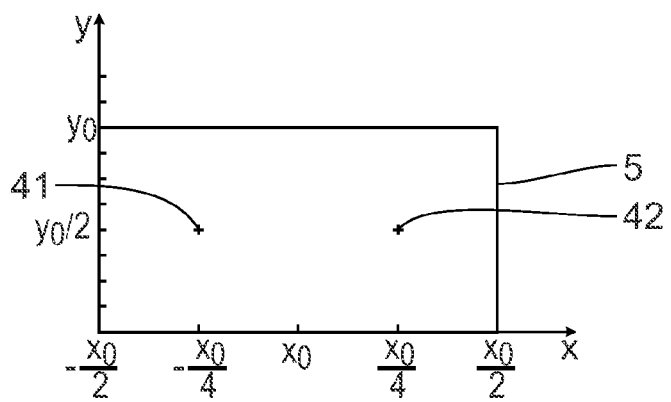
FIG. 5 schematically shows a plan view of the object field, wherein individual object field points which represent images of a specific individual mirror within the change section of the field facet mirror according to FIG. 3 are highlighted.

FIG. 5 schematically shows a plan view of the object field 5. The latter has in the field height dimension x an extent of $x_0$ in the range $[-x_0/2; x_0/2]$. In the y-direction, that is to say in the scanning direction, the object field 5 has an extent of $y=y_0$. The extents firstly of the complete individual-mirror group 25 according to FIG. 2 and secondly of the object field 5 in the x- and y-directions are identical, of course, only if the individual-mirror groups are imaged into the object field 5 with an imaging scale of 1. It then holds true that: $y_1=y_0$, and $x_1=x_0$. Otherwise, the dimensions firstly of the respective complete individual-mirror group 25 and secondly of the object field 5 differ, of course, in each case by the imaging scale in the x- and y-directions.

FIG. 5 illustrates individual-mirror images 41, 42 of a selected individual mirror 27i in the center of the change section 36. Depending on whether the individual mirror 27i belongs to the change section subgroup 36a or to the change section subgroup 36b, it is imaged either onto the individual-mirror image 41 or onto the individual-mirror image 42. The individual-mirror images 41, 42 have the same y-coordinate, namely $y_0/2$.

In the x-direction, the individual-mirror images 41, 42 having the field coordinates $(-x_0/4, y_0/2)$ and $(+x_0/4, y_0/2)$ are at a distance of $x_0/2$ from one another, that is to say a distance corresponding to half an x-extent of the object field 5.

A variant of a division of the change section 36 into change subsections 36c, 36d is explained below with reference to FIGS. 6 and 7. Components and functions which have already been explained above with reference to FIGS. 1 to 5, and particularly with reference to FIGS. 3 and 4, bear the same reference signs and will not be discussed in detail again.

Figure 6:
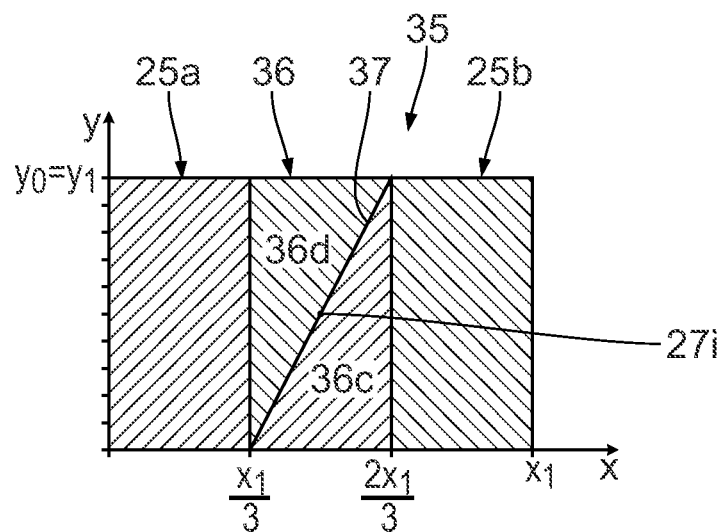
FIG. 6 shows, in an illustration similar to FIG. 3, the segment of the field facet mirror according to FIG. 3 with a variant of an assignment of individual mirrors which are arranged in the change section to the two individual-mirror groups.

In the case of the subdivision of the change section 36 according to FIG. 6, a separating line 37 runs linearly between the coordinates $(x_1/3, 0)$ and $(2/3x_1, y_1)$. Two triangular change subsections 36c, 36d once again result. In this case, the change subsection 36c belongs to the individual-mirror group 25a and the change subsection 36d belongs to the individual-mirror group 25b, as indicated once again by identical hatchings.

The resulting individual-mirror groups 25a, 25b each have the shape of a rectangle and of a right-angled triangle connected thereto only via one point. The two individual-mirror groups 25a, 25b according to FIG. 6, like the individual-mirror group 25a, 25b according to FIG. 3 as well, have a mutually congruent shape.

Figure 7:
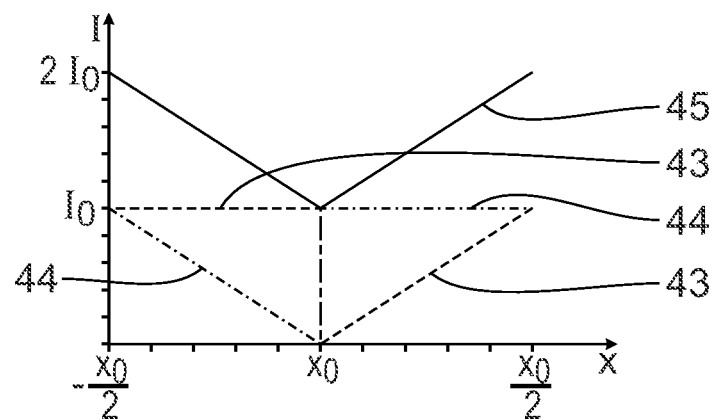
FIG. 7 shows, in an illustration similar to FIG. 4, the dependence of the illumination intensity over the field height in the case of an illumination via the assignment of the individual mirrors to the individual-mirror groups according to FIG. 6.

FIG. 7 shows the effects of the shaping of the individual-mirror groups 25a, 25b according to FIG. 6 on the illumination intensity, once again integrated over the scanning direction y, depending on the field height x. Once again an intensity contribution 43 of the individual-mirror group 25a is illustrated in a dashed manner and an intensity contribution 44 of the individual-mirror group 25b is illustrated in a dash-dotted manner and a total intensity contribution 45, which results as addition of both intensity contributions 43, 44, is illustrated in a solid manner.

In the case of the arrangement according to FIG. 6 as well, the sections of the individual-mirror groups 25a, 25b outside the change section 36 each have the same intensity contribution to the illumination intensity over the field height x as in the case of the embodiment according to FIG. 3. The horizontally proceeding sections of the intensity contributions 43, 44 respectively arise in the field height range $[-x_0/2; 0]$ and in the range $[0; x_0/2]$.

Since the change subsection 36c has a y-extent that increases linearly with the x-dimension, an intensity contribution 43 that increases linearly between $I=0$ and $I=I_0$ arises in the object field region $[0; x_0/2]$. Correspondingly, an intensity contribution 44 that decreases linearly between $I=I_0$ and $I=0$ arises on account of the complementary shape of the change subsection 36d for the field height range $[-x_0/2; 0]$.

In the case of the arrangement of the change subsections 36c, 36d, an illumination light impingement—integrated along the object displacement direction y—of the object field 5, in an edge region of the object field 5, thus takes place over a larger number of individual-mirror illumination channels than in a central region (x=0) of the object field 5.

In total, this results in the total intensity contribution 45, which has an inverse roof shape and in the range $[-x_0/2; 0]$ firstly decreases linearly from $I=2\ I_0$ to $I=I_0$ and then increases linearly again between these values.

With individual-mirror assignments on the field facet mirror 19 firstly corresponding to the segment 35 according to FIG. 3 and secondly corresponding to the segment 35 according to FIG. 6, it is thus possible to compensate for dependencies of an illumination intensity over the field height x in which the illumination intensity for example at the edge is greater than in the center or in which the illumination intensity in the center is greater than at the edge.

A variant of a division of the change section 36 into change subsections 36e, 36f is explained below with reference to FIGS. 8 and 9. Components and functions which have already been explained above with reference to FIGS.

1 to 7, and particularly with reference to FIGS. 3 to 6, bear the same reference signs and will not discussed in detail again.

Figure 8:
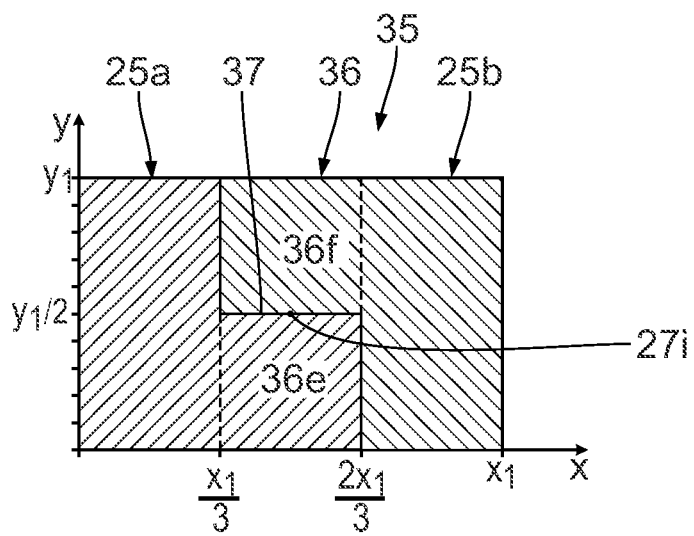
FIGS. 8 and 9 show, in illustrations similar to FIGS. 3 and 4, a further assignment of individual mirrors in the change section to the two individual-mirror groups and also the effects of this assignment on the field height dependence of the illumination intensity, generated by reflection at the resulting individual-mirror groups.

In the case of the segment 35 according to FIG. 8, the change section 36 is subdivided into the change subsection 36e for y-values in the range [0; $y_1/2$] and the change subsection 36f in the y-range [$y_1/2$; $y_1$].

Figure 9:
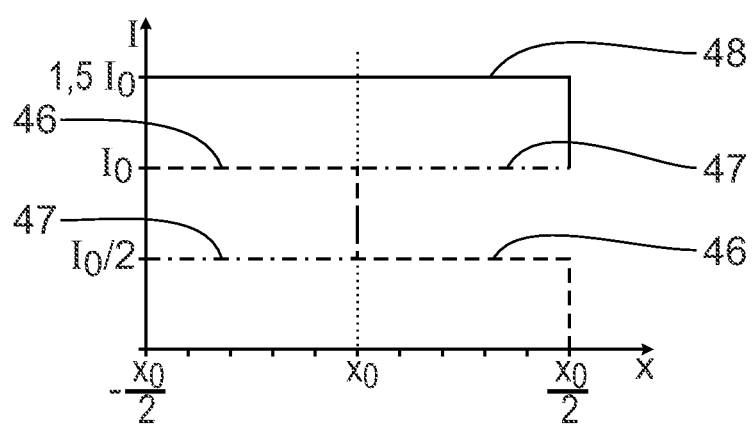

FIG. 9 in turn shows the effects on the dependence of the illumination intensity I on the field height x. The illumination via the change subsections 36e, 36f, which in the y-direction have in each case half the number of individual mirrors 27 in comparison with the other sections of the individual-mirror groups 25a, 25b, leads in each case to an intensity contribution 46 in the field height range [0; $x_0/2$] and to an intensity contribution 47 in the field height range [$-x_0/2$; 0] where $I=I_{0/2}$. When added this results in a total intensity contribution 48 that is constant at $I=1.5\ I_0$ over the entire field height range [$-x_0/2$; $x_0/2$]. In the case of the arrangement of the change subsections 36e, 36f, an illumination light impingement—integrated along the object displacement direction y—of the object field 5, in an edge region of the object field 5, thus takes place via the same number of individual-mirror illumination channels as in a central region (x=0) of the object field 5. Subdivision of the segment 35 with the change subsections 36e, 36f thus leads to an intensity impingement of the object field 5 that is independent over the field height x.

Figure 10:
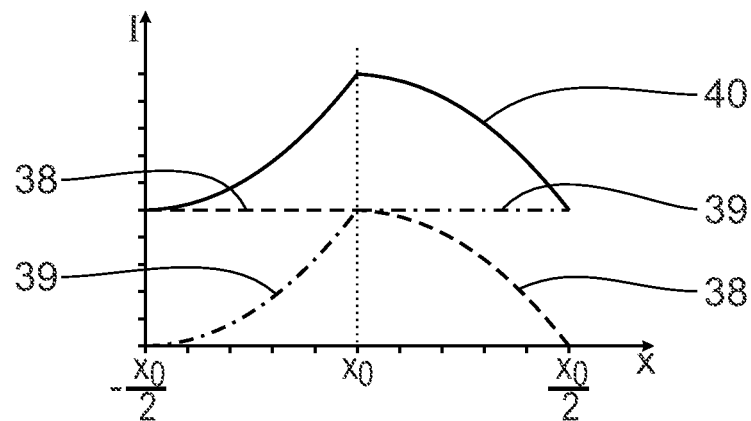
FIG. 10 shows, in an illustration similar to FIG. 4, the dependence of the illumination intensity distribution on the field height in a modification of an individual-mirror assignment in the change section from the assignment according to FIG. 3.
Figure 11:
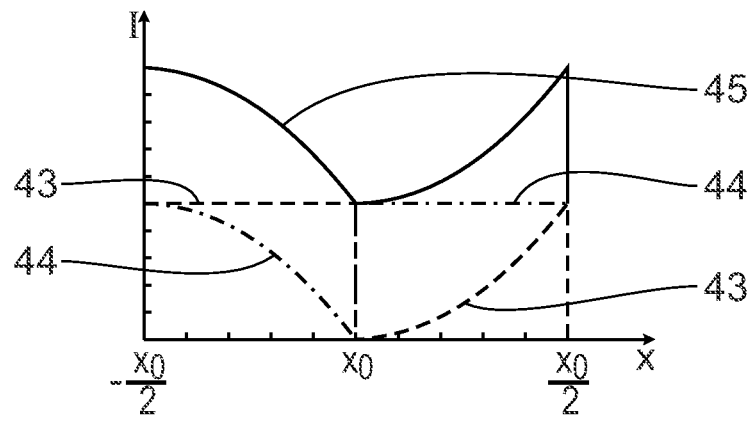
FIG. 11 shows, in an illustration similar to FIG. 7, the dependence of the illumination intensity distribution on the field height in a modification of an individual-mirror assignment in the change section from the assignment according to FIG. 6.

FIGS. 10 and 11 show variants of an intensity dependence of an illumination intensity I over the field height x in the case of subdivisions of the change section 36 similar to the subdivisions according to FIGS. 3 and 6, but in this case not with a linearly proceeding separating line 37, but with a curved, for example parabolically proceeding, separating line 37.

The reference signs firstly for the intensity contributions 38 to 40 and secondly for the intensity contributions 41 to 45 correspond to those which have already been explained above with reference to FIGS. 4 and 7.

A further subdivision of a segment 49 of the field facet mirror 19 into individual-mirror groups 25c, 25d and 25e is explained below with reference to FIGS. 12 and 13. Components and functions corresponding to those which have already been discussed above with reference to FIGS. 1 to 11, and particularly with reference to FIGS. 3 and 5, bear the same reference signs and will not be explained in detail again.

The segment 49 is subdivided into three individual-mirror groups 25c to 25e. If the individual-mirror groups are used as complete individual-mirror groups, these have an x-extent of $x_0$ and a y-extent of $y_0$.

Individual mirrors 27 that can optionally be assigned to the individual-mirror groups 25c or 25d are arranged in a first change section 50 in the segment 49.

Individual mirrors 27 that can optionally be assigned to the individual-mirror groups 25d or 25e are arranged in a second change section 51 in the segment 49.

Unlike the change section 36 of the embodiment according to FIGS. 3, 6 and 8, the two change sections 50, 51 extend over the entire x-extent of the segment 49, that is to say over a length $x_0$.

The change sections 36, 50, 51 can have an extent amounting to between 5% and 80% of the extent of a complete individual-mirror group.

The change sections 50, 51 are triangular in each case. A y-extent of the change section 50 increases linearly from y=0 to y=$y_1/4$ in the positive x-direction. Individual mirrors 27 that can optionally be assigned to the individual-mirror groups 25c or 25d are arranged in a first change section 50 in the segment 49.

Correspondingly, a y-extent of the change section 51 increases from an extent y=0 to an extent y=$y_1/4$ in the negative x-direction. Individual mirrors 27 that can optionally be assigned to the individual-mirror groups 25d or 25e are arranged in the further change section 51 in the segment 49.

If the individual-mirror group 25d situated between the two individual-mirror groups 25c and 25e completely uses the two change sections 50, 51, that is to say if all the individual mirrors within these change subsections 50, 51 are assigned to the individual-mirror group 25d, the individual-mirror group 25d as a complete individual-mirror group having an aspect ratio $x_0/y_0$ has a shape corresponding to a complete individual-mirror group tilted by an angle α. This tilted complete individual-mirror group 25d can then be imaged via a path of a group-mirror illumination channel into the object field 5, wherein an imaging tilting arises that is precisely compensated for by the tilted contour of the complete individual-mirror group 25. A compensation of an imaging tilting results.

Figure 12:
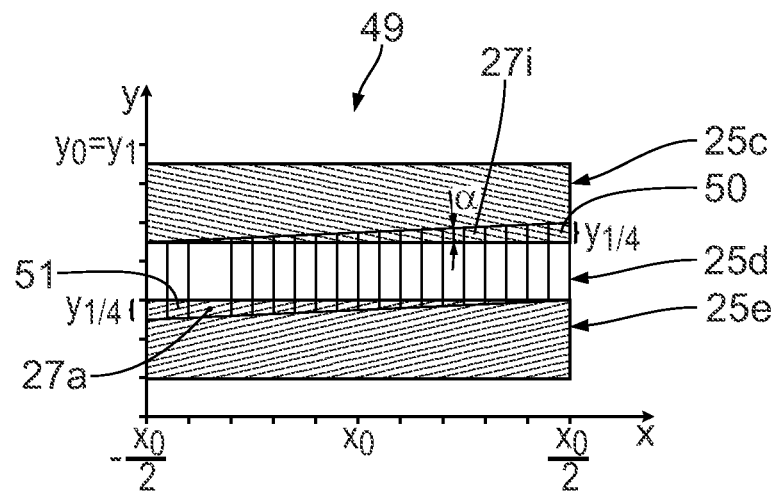
FIG. 12 schematically shows a plan view of a segment of the field facet mirror constructed from individual mirrors, wherein an assignment of the individual mirrors, not specifically illustrated, to three possible individual-mirror groups is highlighted, wherein two wedge-shaped change sections that arise over the entire side of the segment that corresponds to a field height dimension arise in which individual mirrors are present which respectively after tilting are assignable to two different individual-mirror groups from among the three individual-mirror groups.

If the change section 50 is completely assigned to the upper individual-mirror group 25d in FIG. 12, then a complete individual-mirror group 25c results. If the change section 51 is assigned to the lower individual-mirror group 25e in FIG. 12, a complete individual-mirror group 25e in turn results.

Figure 13:
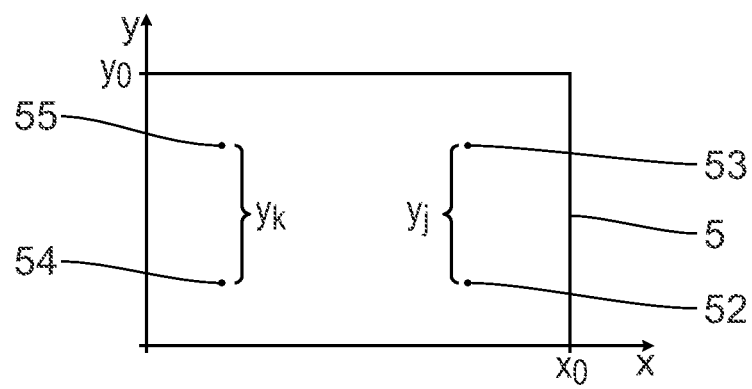
FIG. 13 shows, in an illustration similar to FIG. 5, the object field, wherein the images of two individual mirrors which are arranged in each case in a change section of the segment of the field facet mirror according to FIG. 12 are highlighted.

FIG. 13 shows, in the object field 5, images of two selected individual mirrors $27_j$, $27k$ in the change sections 50 and 51, depending on the individual-mirror group assignment thereof.

An image 52 of the individual mirror $27_j$ in the case of assignment to the individual-mirror group 25c arises in the object field 5 in the lower right quadrant. In the case of the assignment of the field facet $27_j$ to the individual-mirror group 25d, an image 53 of the field facet $27_j$ arises in the upper right quadrant of the object field 5. A y-distance $y_j$ between these two images 52, 53 is greater than 40% along the scanning direction y and is, for example, 0.7 $y_0$.

Images 54, 55 of the individual mirror 27k correspondingly arise in the case of its assignment to the individual-mirror group 25b or 25d. The distance $y_k$ in the y-direction between the images 54 and 55 is once again approximately 0.7 $y_0$. The distances $y_j$, $y_k$ depend on what x-coordinate the individual mirrors $27_j$, 27k have in the change sections 50, 51.

FIG. 14 shows by way of example a division of the entire field facet mirror 19 into individual-mirror groups 25. In this case, each individual mirror 27 of the field facet mirror 19 is assigned to exactly one individual-mirror group 25. The individual-mirror groups 25 are firstly complete individual-mirror groups and secondly fractional individual-mirror groups. The individual mirrors 27 of the field facet mirror 19 are arranged in a far field 56 (also cf. FIG. 1) of the light source 2 such that at least 80% of an area of the far field 56 is covered by the individual mirrors 27 such that the latter reflect the illumination light 16.

FIG. 15 shows by way of example two different distributions of a scan-integrated illumination intensity over the field height x, the distributions being achievable depending on a division of the field facet mirror 19 into complete individual-mirror groups and fractional individual-mirror groups. This illustrates that, firstly, an intensity distribution 57 having great x-dependence and, secondly, an intensity distribution 58 having practically vanishing x-dependence, in each case with use of all the individual mirrors 27 of the field facet mirror 19, can be achieved. In order to achieve these two different intensity distributions 57, 58, specific individual mirrors 27 are assigned in each case to other individual-mirror groups only in corresponding change sections in segments of the field facet mirror 19.

In principle, change section configurations can be such that in the case of a change of an individual mirror, depending on the individual-mirror tilting position, the individual mirror is imaged onto different field heights of the object field. This can generally be used for the correction of an intensity distribution over the object field height. Alternatively, a change section can be configured such that a change of an individual mirror arranged in the change section, depending on the tilting position of the individual mirror between the individual-mirror groups, does not lead to any change in a field height position of the individual mirror in the object field. This can be used for the correction of an imaging of the individual-mirror groups into the object field, which correction does not affect the field height dependence of the illumination intensity distribution.

The correction or compensation mechanisms explained are free of losses since the correction can be carried out without light that is guided via individual-mirror illumination channels being lost.

During projection exposure with the aid of the projection exposure apparatus 1, firstly the illumination system 3 is set up, wherein the field facet mirror 19 is designed and arranged such that it covers at least 80% of a far field area to be used with the individual mirrors 27. A subdivision of the individual-mirror array of the field facet mirror 19 into individual-mirror groups including defined change sections is subsequently predefined. This is then followed by a calibration measurement, which involves measuring an x-dependence of a scan-integrated illumination intensity for a predefined illumination setting, that is to say for a given illumination angle distribution. This can result in an x-dependence corresponding to the intensity distribution 57, for example. Afterward, by suitably changing an assignment of individual mirrors 27 that are arranged in change sections to in each case other individual-mirror groups, a compensation of an x-dependence of the scan-integrated illumination intensity is performed until a distribution of the type of the intensity distribution 58 results, for example. In order to compensate for a distribution of the type of the intensity distribution 57, by way of example, individual mirrors 27 in change sections of the type in FIGS. 6 and 7 can be assigned to individual-mirror groups such that a higher intensity in the field center (region x=0) is compensated for.

After this setting of the illumination system 3 has been performed, at least one part of the reticle 7 in the object field 5 is imaged onto a region of the light-sensitive layer onto the wafer 13 in the image field 11 for the lithographic production of a micro- or nanostructured component, in particular of a semiconductor component, for example of a microchip. In this case, the reticle 7 and the wafer 13 are moved in a temporally synchronized manner in the y-direction continuously in scanner operation.

What is claimed is:

1. An illumination optical unit configured to guide illumination light toward an object field in which a lithography mask is arrangeable and displaceable along an object displacement direction, the illumination optical unit comprising:

a field facet mirror comprising a multiplicity of individual mirrors which are switchable between at least two tilting positions and which provide individual-mirror illumination channels for guiding illumination light partial beams toward the object field during use of the illumination optical unit; and a pupil facet mirror downstream of the field facet mirror along a beam path of the illumination light through the illumination optical unit, the pupil facet mirror comprising a plurality of stationary pupil facets configured so that, during use of the illumination optical unit, each pupil facet contributes to at least sectional superimposed imaging of a group of the individual mirrors of the field facet mirror into the object field via a group-mirror illumination channel, wherein:

a pupil facet is assigned to a corresponding group of the individual mirrors that are to be imaged;

an individual-mirror group that is completely imageable into the object field has a nominal number of individual mirrors;

a number of the pupil facets, on which illumination light is impingeable simultaneously via the individual-mirror groups, multiplied by the nominal number of the individual mirrors per individual-mirror group, yields a number that is greater than an actual number of the individual mirrors on the field facet mirror; and an assignment of the individual mirrors to the individual-mirror groups is such that, during use of the illumination optical unit, the assignment is used to correct a dependence of an illumination light intensity integrated along the object displacement direction on an object field height perpendicular to the object displacement direction.

2. The illumination optical unit of claim 1, wherein:

at least some of the individual mirrors are arranged in at least one change section of the field facet mirror;

the individual mirrors within the change section, depending on the individual-mirror tilting position, are assignable to two different individual-mirror groups that are imaged into the object field via different pupil facets; and the change section has an extent perpendicular to the object displacement direction which, imaged into the object field during use of the illumination optical unit, amounts to at most half of an extent of the object field perpendicular to the object displacement direction.

3. The illumination optical unit of claim 2, wherein the change section is arranged such that an individual mirror arranged in the change region, depending on the individual-mirror tilting position and its assignment to the respective individual-mirror group, is imaged during use of the illumination optical unit in the image positions whose distance from one another perpendicular to the object displacement direction is greater than 10% of an extent of the object field perpendicular to the object displacement direction.

4. The illumination optical unit of claim 2, wherein the change section is arranged such that an individual mirror that is arranged in the change region, depending on the individual-mirror tilting position and its assignment to the respective individual-mirror group, is imaged during use of the illumination optical unit in image positions whose distance from one another in the object displacement direction is greater than 40% of an extent of the object field in the object displacement direction.

5. The illumination optical unit of claim 2, wherein an assignment of the individual mirrors in the change section of the field facet mirror is such that, during use of the illumination optical unit, the two individual-mirror groups that include the individual mirrors in the change section result in an illumination light impingement—integrated along the object displacement direction—on the object field in a central region of the object field via a larger number of individual—mirror illumination channels and in an edge region of the object field.

6. The illumination optical unit of claim 2, wherein an assignment of the individual mirrors in the change section of the field facet mirror is such that, during use of the illumination optical unit, the two individual-mirror groups that include the individual mirrors in the change section result in an illumination light impingement—integrated along the object displacement direction—on the object field in an edge region of the object field via a larger number of individual-mirror illumination channels than in a central region of the object field.

7. The illumination optical unit of claim 2, wherein an assignment of the individual mirrors in the change section of the field facet mirror is such that, during use of the illumination optical unit, the two individual-mirror groups that include the individual mirrors in the change section result in an illumination light impingement—integrated along the object displacement direction—on the object field in an edge region of the object field via a number of individual-mirror illumination channels than in a central region of the object field.

8. An illumination system, comprising:
an illumination optical unit as claimed claim 1; and
an EUV light source configured to provide the illumination light.

9. An apparatus, comprising:
an illumination optical unit as claimed in claim 1; and
a projection optical unit configured to project a lithography mask in the object plane into an image plane,
wherein the apparatus is a projection exposure apparatus.

10. A method of using a projection exposure apparatus comprising an illumination optical unit and projection optical unit, the method comprising:
using the illumination optical unit to illuminate at least some structures on a lithography mask; and
using the projection optical unit to project at least a portion of the illuminated structures of the lithography mask onto a light sensitive material,
wherein the illumination optical unit comprises an illumination optical unit as claimed in claim 1.

11. An illumination optical unit configured to guide illumination light toward an object field in which a lithography mask is arrangeable and displaceable along an object displacement direction, the illumination optical unit comprising:
a field facet mirror comprising a multiplicity of individual mirrors which are switchable between at least two tilting positions and which provide individual-mirror illumination channels for guiding illumination light partial beams toward the object field during use of the illumination optical unit; and
a pupil facet mirror downstream of the field facet mirror along a beam path of the illumination light through the illumination optical unit, the pupil facet mirror comprising a plurality of stationary pupil facets configured so that, during use of the illumination optical unit, each pupil facet contributes to at least sectional superimposed imaging of a group of the individual mirrors of the field facet mirror into the object field via a group-mirror illumination channel, wherein:
a pupil facet is assigned to a corresponding group of the individual mirrors that are to be imaged;
an individual-mirror group that is completely imageable into the object field has a nominal number of individual mirrors;
a number of the pupil facets, on which illumination light is impingeable simultaneously via the individual-mirror groups, multiplied by the nominal number of the individual mirrors per individual-mirror group, yields a number that is greater than an actual number of the individual mirrors on the field facet mirror; and
an assignment of the individual mirrors to the individual-mirror groups is such that, during use of the illumination optical unit, the assignment is used to correct imaging tilting of the respective individual-mirror group into the object field.

12. The illumination optical unit of claim 11, wherein:
at least some of the individual mirrors are arranged in a change section of the field facet mirror;
the individual mirrors within the change section, depending on the individual-mirror tilting position, are assignable to two different individual-mirror groups that are imaged into the object field via different pupil facets during use of the illumination optical unit; and
the change section has an extent along the object displacement direction which increases monotonically in a dimension perpendicular to the object displacement direction.

13. An illumination system, comprising:
an illumination optical unit as claimed claim 11; and
an EUV light source configured to provide the illumination light.

14. An apparatus, comprising:
an illumination optical unit as claimed in claim 11; and
a projection optical unit configured to project a lithography mask in the object plane into an image plane,
wherein the apparatus is a projection exposure apparatus.

15. A method of using a projection exposure apparatus comprising an illumination optical unit and projection optical unit, the method comprising:
using the illumination optical unit to illuminate at least some structures on a lithography mask; and
using the projection optical unit to project at least a portion of the illuminated structures of the lithography mask onto a light sensitive material,
wherein the illumination optical unit comprises an illumination optical unit as claimed in claim 11.

16. An illumination system, comprising:
an EUV light source configured to provide illumination light;
an illumination optical unit configured to guide the illumination light toward an object field in which a lithography mask is arrangeable and displaceable along an object displacement direction, the illumination optical unit comprising:
a field facet mirror arranged in a far field of the EUV light source, the field facet mirror comprising a multiplicity of individual mirrors which are switchable between at least two tilting positions and which provide individual-mirror illumination channels for guiding illumination light partial beams toward the object field during use of the illumination system, wherein:
the individual mirrors are groupable into individual-mirror groups which are assigned in each case to pupil facets of a pupil facet mirror disposed downstream of the field facet mirror in a beam path of the illumination light through the illumination system to image the respective individual-mirror group into the object field via the assigned pupil facet during use of the illumination system so that generated images of the individual-mirror groups are at least partly superimposed in the object field; and the individual mirrors of the field facet mirror are arranged in the far field of the light source such that a proportion of at least 80% of an area of the far field is covered by the individual mirrors such that the latter reflect the illumination light during use of the illumination system.

17. The illumination system of claim 16, wherein the illumination system is configured so that, during use of the illumination system, the individual mirrors that reflect the illumination light are imaged into the object field.

18. The illumination system of claim 16, further comprising an EUV light source configured to provide the illumination light.

19. An apparatus, comprising:
an illumination system as claimed in claim 16; and
a projection optical unit configured to project a lithography mask in the object plane into an image plane,
wherein the apparatus is a projection exposure apparatus.

20. A method of using a projection exposure apparatus comprising an illumination system and projection optical unit, the method comprising:
using the illumination system to illuminate at least some structures on a lithography mask; and
using the projection optical unit to project at least a portion of the illuminated structures of the lithography mask onto a light sensitive material,
wherein the illumination system comprises an illumination system as claimed in claim 16.

* * * * *

UNITED STATES PATENT AND TRADEMARK OFFICE
CERTIFICATE OF CORRECTION

PATENT NO. : 9,921,484 B2
APPLICATION NO. : 15/067436
DATED : March 20, 2018
INVENTOR(S) : Martin Endres Page 1 of 1

It is certified that error appears in the above-identified patent and that said Letters Patent is hereby corrected as shown below:

In the Specification

Column 2, Line 14: Delete "diplacement" and insert -- displacement --, therefor.

Column 9, Line 30: Delete "xo." and insert -- $x_0.$ --, therefor.

Column 11, Line 54: Delete "xo" and insert -- $x_0$ --, therefor.

Column 16, Line 31: Change "27k" to -- $27_K$ --.

Column 16, Line 42: Change "27k" to -- $27_K$ --.

Column 16, Line 47: Change "27k" to -- $27_K$ --.

Signed and Sealed this
Twenty-fourth Day of July, 2018

Andrei Iancu
*Director of the United States Patent and Trademark Office*